United States Patent [19]
Krainhöfer
[11] Patent Number: 4,815,558
[45] Date of Patent: Mar. 28, 1989

[54] DEVICE FOR ACCOMODATING A LOUDSPEAKER INTO A CUT-OUT OF A SOUND PANEL

[75] Inventor: Günter L. Krainhöfer, Solms, Fed. Rep. of Germany
[73] Assignee: U.S. Philips Corp., New York, N.Y.

[21] Appl. No.: 934,049
[22] Filed: Nov. 24, 1986
[30] Foreign Application Priority Data
Nov. 23, 1985 [DE] Fed. Rep. of Germany ....... 3541493
[51] Int. Cl.[4] .............................................. H05K 5/00
[52] U.S. Cl. .................................... 181/141; 181/148; 181/150; 181/171; 381/86; 381/205
[58] Field of Search ............... 181/148, 150, 158, 171, 181/172, 175, 141; 381/169, 205, 86

[56] References Cited

U.S. PATENT DOCUMENTS 3,188,374 6/1965 Schotter ............................. 181/175
3,859,480 1/1975 Birkner et al. .................. 181/171 X
4,072,829 2/1978 Ogihara .............................. 381/205
4,277,653 7/1982 Pawelzick ....................... 181/150 X
4,326,599 4/1982 Thompson et al. ................ 181/175

FOREIGN PATENT DOCUMENTS 8412555 8/1984 Fed. Rep. of Germany .

*Primary Examiner*—Benjamin R. Fuller
*Attorney, Agent, or Firm*—Bernard Franzblau

[57] ABSTRACT

A device for fitting a loudspeaker (17) into a cut-out of a sound panel, in particular into cut-outs of the most varied types of sound panel of motor vehicles. The loudspeaker can be fitted by its frame border (15) in each case into a mount adapted to the cut-out and which mount has a sound passage (3) in the shape and size of the frame border (15). The frame border is secured to the mount in the region of the border of the sound passage (3). The mount is in the form of an intermediate plate (1) which has mechanisms (7, 27) for the quick fastening of a loudspeaker frame border of the same shape and size.

6 Claims, 1 Drawing Sheet

DEVICE FOR ACCOMODATING A LOUDSPEAKER INTO A CUT-OUT OF A SOUND PANEL

This invention relates to a device for accommodating a loudspeaker into a cut-out of a sound panel, in particular of a motor vehicle, the loudspeaker being adapted to fit by its frame border into a mount adapted to the cut-out and with a sound passage in the shape and size of the frame border and the frame border being adapted to secure itself in the region of the border of the sound passage by means of quick fastening with clip hooks. The mount is provided between the sound panel and the loudspeaker and includes the quick fastenings.

Such a device is known (German Utility Model No. 8,412,555). On the mount of this device are provided pockets for a loudspeaker frame, into which pockets the frame can be pushed from one side. On the opposite side, it is snapped into an engagement groove along the inclined run-up aeas at engagement tongues.

It is an object of the invention to create a device of the type mentioned above which is provided with a clamping quick fastening which is simple and resistant to ageing.

The foregoing object is achieved according to the invention by the characterizing features of claim 1.

Loudspeaker mounts to day generally consist of plastic injection mouldings and therefore the mount is also a plastic injection moulding onto which the clip hooks and the collar are moulded. Inexpensive plastics are generally subject to ageing, which depends on the temperatures to which the plastics are exposed during use. It is therefore possible that the pressing or gripping force of the clip hooks diminishes after a certain time. To counter this diminution of the clamping or gripping force, a retaining ring is provided which, when fitted over the collar and the clip hooks, presses the clip hooks inward against the loudspeaker frame border. Such a retaining ring provides adequate clamping force for the clip hooks over the service life of the mount.

In a further development of the invention, the clip hooks are provided with a corrugated profile on their outside walls, which corresponds to a corrugated profile on the inner wall of the retaining ring. These corrugated profiles ensure that, once fitted, the retaining ring is securely seated on the intermediate plate and cannot be accidentally detached. In the event that it is desired that the retaining ring is once again perfectly detachable, a further development of the invention provides that the corrugations are designed in the manner of a threaded profile with a slight pitch. In this way, after securing, the retaining ring can be unscrewed again from the intermediate plate at the desired time.

The invention will be explained in more detail with reference to the exemplary embodiment represented in the drawing in which, FIG. 1 shows in illustrative exploded representation an intermediate plate of a loudspeaker mount, which is not otherwise represented. A loudspeaker can be clipped onto the intermediate plate, and the clip hooks of the intermediate plate can be safeguarded against bending back with the aid of a retaining ring.

Figures 1, 2, 3:
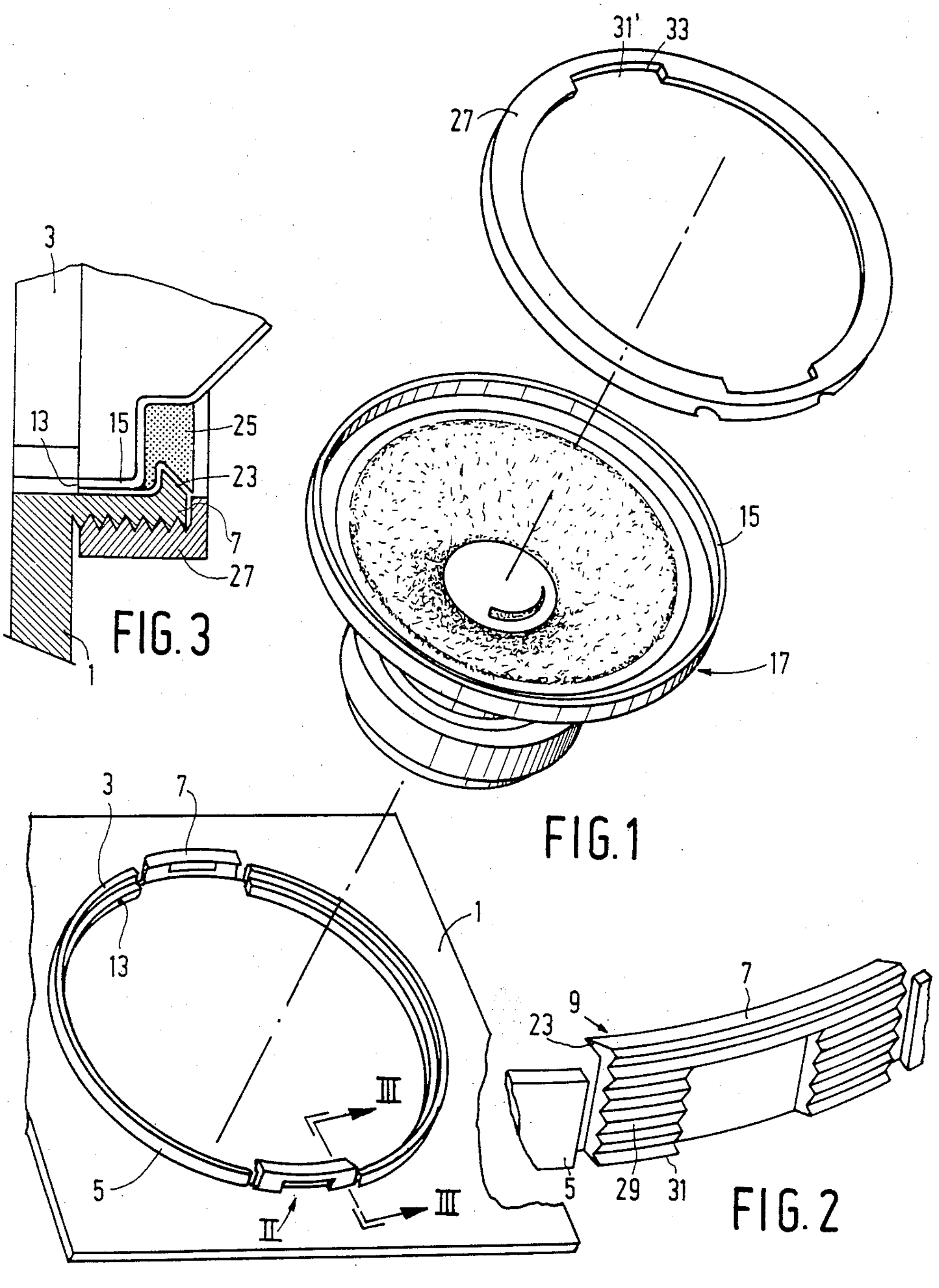
FIG. 2 shows a section of the intermediate plate according to FIG. 1, in enlarged representation, with clip hook.
FIG. 3 shows a section along the line III—III through the frame bead of a loudspeaker secured on the intermediate plate.
FIG. 1 shows a mount for a loudspeaker in the form of an intermediate plate 1, which plate is adapted in its outer dimensions and in its shape to a sound panel cut-out of a certain motor vehicle type.

The intermediate plate 1 has a sound passage 3 which is surrounded by an upright collar 5. This upright collar 5 is interrupted by at least two clip hooks 7. The intermediate plate 1, the collar 5 and the clip hooks 7 are injection-moulded from plastic in one piece; The clip hooks 7 have a certain restoring elasticity and can be bent back in the direction of an arrow 9 according to FIG. 2. The border 11 of the sound passage 3 has inwardly projecting projections 13, which form the rests for a bead 15 of a loudspeaker 17.

The loudspeaker 17 can be fitted into the intermediate plate 1, the frame bead 15 of the loudspeaker frame being pushed by its front border 21 against the projections 13. For the sake of clarity, the loudspeaker 17 is drawn in FIG. 1 in a position in which the front side of the loudspeaker is turned away from the intermediate plate 1. It should be clear that in reality the front side of the loudspeaker faces the intermediate plate 1. When fitting the loudspeaker 17 into the intermediate plate 1, the clip hooks 7 are bent back until the frame bead 15 has arrived behind the lugs 23 of the clip hooks 7. Owing to their restoring force, the clip hooks 7 have then projected and the lugs 23 have come over the frame bead 15. To avoid rattling effects, in addition a damping ring 25 is preferably placed over the frame bead 15, into which and over which damping ring the lugs 23 engage. This design is clearly recognizable from FIG. 3. The damping ring is not shown in FIG. 1.

In FIG. 1 there is another retaining ring 27 represented. This retaining ring 27 is pushed over the outer wall of the collar 5 after fitting the loudspeaker 17 into the intermediate plate 1. In so doing, the retaining ring engages behind the clip hooks 7 and safeguards them from unintended giving way.

As can be seen from FIG. 2, which shows a section II according to FIG. 1, the outside 29 of the clip hooks 7 is provided with a corrugation 31. The retaining ring 27 has a corresponding corrugation 31' on its inside in the regions 33, which engage behind the clip hooks 7. If the corrugations 31 and 31' are designed in the form of helical lines with a slight pitch, the retaining ring 27 can, after it has been pushed on, be released again from the intermediate plate 1 by turning.

For each sound panel cut-out of one type of a certain motor vehicle make, the dealer need only stock in each case one mount with an intermediate plate according to the invention. Only when the customer has decided with loudspeaker of which quality he is considering buying does the salesman clip the required loudspeaker into the mount. This quick fastening is extremely fast and can be performed within a few seconds. Owing to the design of the loudspeaker mount with intermediate plate and quick fastening, the dealer now no longer needs to keep mounts with loudspeakers of different qualities available. This considerably simplifies stock keeping.

What is claimed is:

1. A device for accomodating a loudspeaker into a cut-out of a sound panel, in particular of a motor vehicle, the loudspeaker having a frame with a frame border adapted to fit into a mount covering the cut-out, said mount being provided with a sound passage in substantially the shape and size of the frame border and with at least one clip hook in the region of the border of the sound passage for securing the loudspeaker frame border to the mount, characterized in that a collar is arranged around the border of the sound passage, said collar being interrupted by at least one clip hook, and a retaining ring fitted over the collar and the clip hook so that it presses the clip hook inward against the frame border of the loudspeaker.

2. A device according to claim 1, characterizxed in that the clip hook has outer walls provided with a corrugated profile which corresponds to a corrugated profile on an inside wall of the retaining ring.

3. A device according to claim 2, characterized in that the corrugations comprise a threaded profile with a slight pitch.

4. A device as claimed in claim 1 wherein the mount supports a second clip hook for securing the loudspeaker frame border to the mount, said clip hooks being made of a resilient material.

5. A device as claimed in claim 4 wherein an outer wall of the second clip hook contains a corrugated profile which corresponds to a corrugated profile on an inside wall of the retaining ring.

6. A device as claimed in claim 5 wherein the retaining ring has two notches therein in registry with respective ones of said clip hooks.

* * * * *